United States Patent [19]

Burnham et al.

[11] Patent Number: 4,730,331
[45] Date of Patent: Mar. 8, 1988

[54] SUPERLUMINESCENT LED SOURCE

[75] Inventors: Robert D. Burnham, Palo Alto; Thomas L. Paoli, Los Altos; Robert L. Thornton, East Palo Alto; all of Calif.

[73] Assignee: Xerox Corporation, Stamford, Conn.

[21] Appl. No.: 874,982

[22] Filed: Jun. 16, 1986

Related U.S. Application Data

[62] Division of Ser. No. 719,595, Apr. 3, 1985, Pat. No. 4,638,334.

[51] Int. Cl.[4] .............................................. H01S 3/19
[52] U.S. Cl. ...................................... 372/50; 357/16; 357/17; 372/44
[58] Field of Search ...................... 372/49, 50, 46, 48, 372/45, 44; 357/17, 16

[56] References Cited

U.S. PATENT DOCUMENTS

| | | | |
|---|---|---|---|
| 3,849,738 | 11/1974 | Hakki | 372/49 |
| 3,934,961 | 1/1976 | Itoh et al. | 350/164 |
| 3,943,462 | 3/1976 | Thompson | 372/49 |
| 4,001,719 | 1/1977 | Krupka | 331/94.5 |
| 4,092,659 | 5/1978 | Ettenberg | 372/49 |
| 4,281,904 | 8/1981 | Sprague et al. | 350/356 |
| 4,367,925 | 1/1983 | Sprague et al. | 350/356 |
| 4,369,457 | 1/1983 | Sprague | 346/160 |
| 4,370,029 | 1/1983 | Sprague et al. | 350/355 |
| 4,376,946 | 3/1983 | Kaminow et al. | 357/17 |
| 4,437,106 | 3/1984 | Sprague | 346/160 |
| 4,450,459 | 5/1984 | Turner et al. | 346/160 |
| 4,455,562 | 6/1984 | Dolan et al. | 346/154 |
| 4,480,899 | 11/1984 | Sprague | 350/356 |
| 4,483,596 | 11/1984 | Marshall | 350/385 |
| 4,563,368 | 1/1986 | Tihanyi et al. | 372/49 |

OTHER PUBLICATIONS

J. C. Marinace, "Electrical Positioning of Lenses on Semiconductor Lasers" IBMTDB, vol. 19, No. 5, p. 1948, Oct., 1976.
R. C. Miller et al., "A Gallium-Arsenide Laser Facsimile Printer", The Bell System Techinical Journal, vol. 58(9), pp. 1909–1997, Nov., 1979.
G. Eisenstein, "Theorectical Design of Single-Layer Antireflection Coatings on Laser Facets", AT&T Bell Laboratories Technical Journal, vol. 63(2), pp. 357–364, Feb., 1984.
G. Eisenstein et al., "High Quality Antireflection Coatings on Laser Facets by Sputtered Silicon Nitride", Applied Optics, vol. 23(1), pp. 161–164, Jan. 1, 1984.
I. P. Kaminow et al., "Measurement of the Modal Reflectivity of an Antireflection Coating on a Superluminescent Diode", IEEE Journal of Quantum Electronics, vol. QE-19, No. 4, Apr., 1983.
G. W. DeBell, "Visible Anit-reflection Coatings and their Use", Proceedings of SPIE, vol. 50, pp. 69–85, Aug. 19–20, 1974.

*Primary Examiner*—James W. Davie
*Attorney, Agent, or Firm*—W. Douglas Carothers, Jr.

[57] ABSTRACT

A light source comprises a semiconductor laser having a plurality of deposited semiconductor layers including an active region consisting of a plurality of layers forming at least two quantum wells in the active region. The layers immediately adjacent to the active region provide confinement for light generated in one or more optical cavities established in the active region and propagating between end facets of the source. Means, such as in the form of an antireflection (AR) coating, is provided to convert the semiconductor laser into a superluminescent LED source. Further, means is provided to broaden the wavelength spectral emission from the source by rendering the energy levels present in the quantum wells to be at different levels between or among the quantum wells. The resulting output beam has high output intensity and a uniform far field pattern without intensity variation along the beam width particularly useful as a superluminescent LED source for electrooptic line TIR modulators and line printers.

15 Claims, 15 Drawing Figures

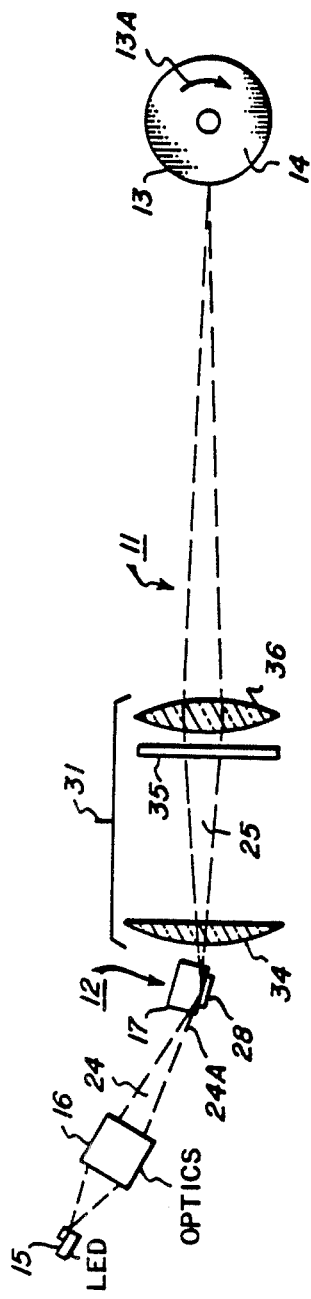
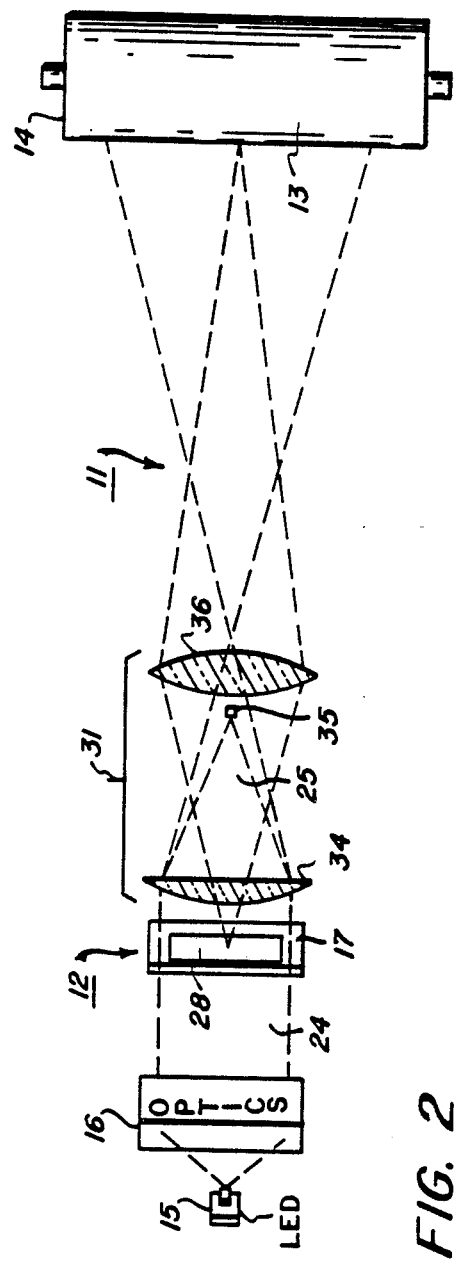
FIG. 1
FIG. 2

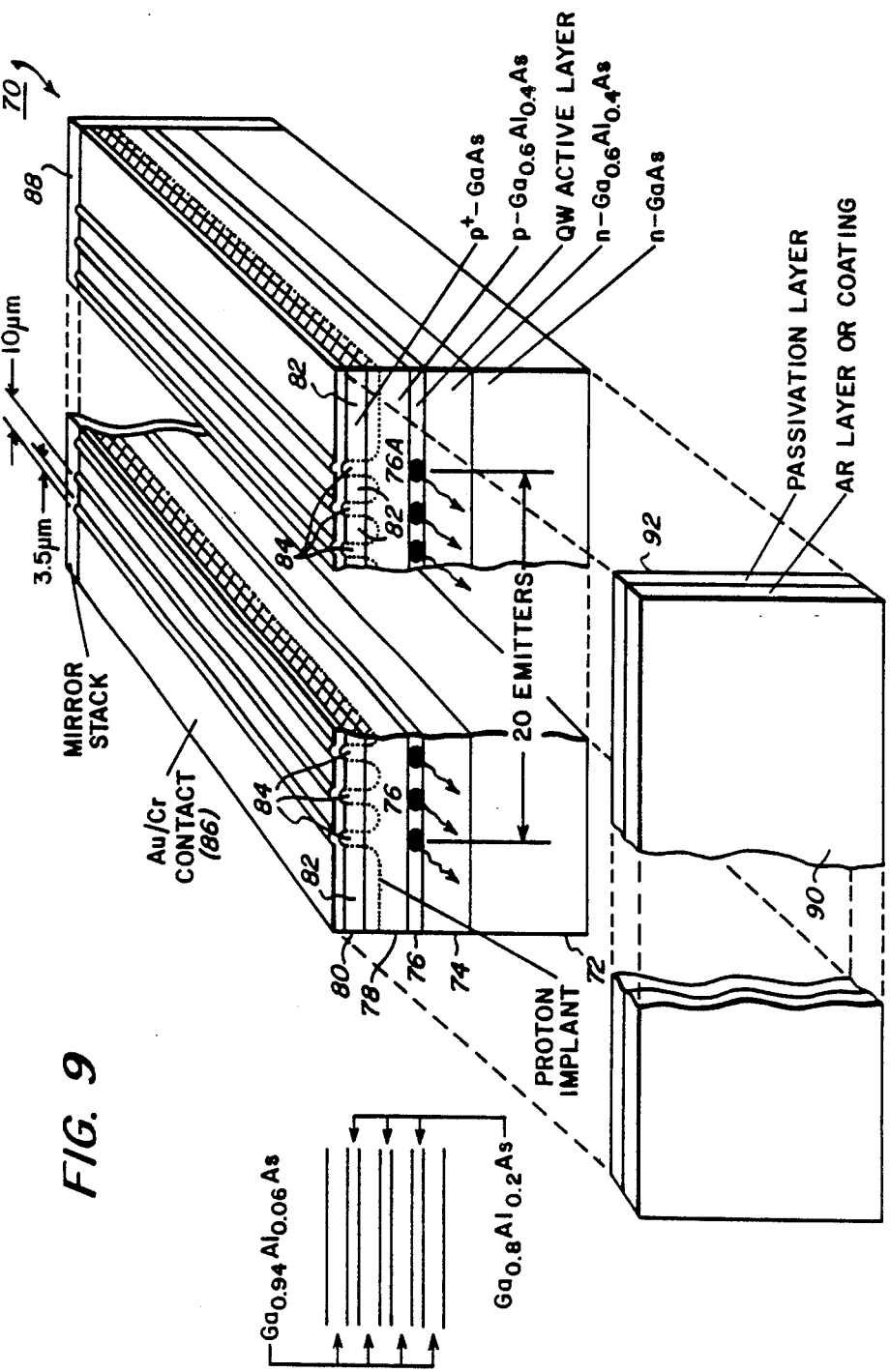

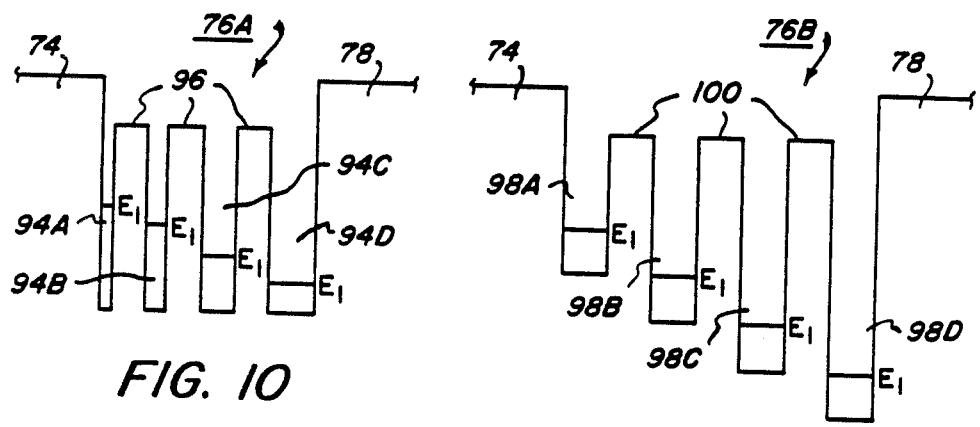
FIG. 10
FIG. 11
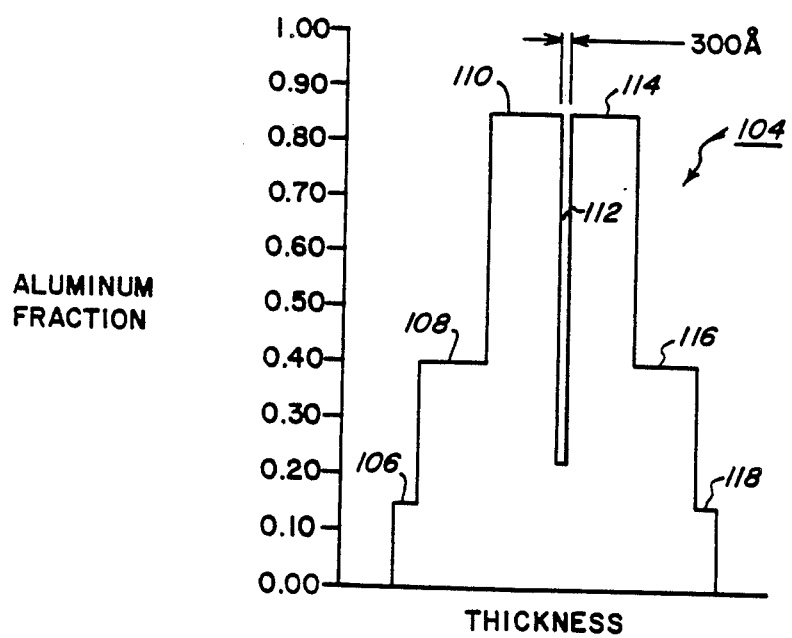
FIG. 13

SUPERLUMINESCENT LED SOURCE

This is a division, of application Ser. No. 719,595, filed Apr. 3, 1985, now U.S. Pat. No. 4,638,334.

BACKGROUND OF THE INVENTION

This invention relates to light emitting diodes (LEDs) and in particular LEDs having a broad uniform far field with high intensity which are highly adaptable for use as illuminating sources with electro-optic line modulators and electro-optic line printers.

In the prior art, semiconductors lasers and LEDs have been employed as a light source to produce an image on a photosensitive medium such as a xerographic photoreceptor used in a xerographic printer. In this kind of application, there is a need for uniformity of the intensity of light in the image as well as sufficient intensity of the light emitted. Further, if LEDs have to be utilized, it is necessary to provide a full width array of LEDs, one per picture element or pixel so that a line of light can be formed for discharge of the photoreceptor in an imagewise manner. Usually a plurality of light emitting device arrays are arranged in one or more rows and optical means is positioned between the photosensitive medium and the light source array to focus the light from the array sources to a single line on the surface of the photosensitive medium. The light sources are selectively turned on and off to effect line-by-line exposure of the moving photosensitive medium.

Semiconductor lasers have also been used in the past have been used as such light sources for rotating polygon scanned printers because of their high intensity. They have not, however, been totally best suited for application in electro-optic line printers due to a lack of uniformity of light intensity. In particular, coherent laser sources possess a far field pattern containing regions of high intensity and of low intensity in the single beam far field. Such a variation in intensity across the beam output is not desired because the line exposure on the photosensitive medium will not be uniform. For this and other reasons, LEDs are more favored as a light source because they may be designed to provide a light output of uniform intensity with very short coherence length.

In some cases, LEDs in the past have not provided sufficient output power and intensity to accomplish in an efficient manner the task of exposing a charged and moving photosensitive medium. For this reason, LEDs as light sources for xerographic photoreceptor applications have lacked the output intensity level for good photoreceptor discharge and as a result, semiconductor lasers have been still favored in many cases as the light source for printer applications.

Beside the problem of sufficiency of LED intensity, the maintenance of light output uniformity among a plurality of LEDs, as alluded to above, is a recognized problem in the art. To insure that the intensity of the broad light emission from the array is uniform across an LED array, elaborate control systems have been designed to provide for light intensity uniformity as exemplified, for example, in U.S. Pat. No. 4,455,562. This patent utilizes a binary weighted duty cycle control to obtain substantial uniformity in the light emitted from each LED in the array of LEDs.

The highest power LEDs have been top emitter types, but they lack power density necessary for most printer applications, i.e., they lack from sufficient light density per aperture size.

A most recent advancement in the printer arts has been the concept of a total internal reflection (TIR) line modulator which is a solid state multi-gate light valve that may be used to address a photosensitive medium. The line TIR modulator comprises a crystal bar of electro-optic material with an array of interdigital electrodes deposited on one of its major surfaces, which electrodes, when electrically addressed, introduce or induce a periodic electric field into the bulk crystal. Each of the electrodes may be individually addressed by an electronic signal forming a signal pattern across the array. A broad or wide sheetlike beam of high intensity light is required for the line modulator. The beam is introduced into the crystal at an angle incident to the plane of the major surface incorporating the electrodes. An example of the line TIR modulator is disclosed in U.S. Pat. No. 4,281,904 to Robert A Sprague et al.

To carry out the exposure process of the photosensitive medium, a sheetlike beam of light is transmitted through the electro-optic element of the TIR line modulation at a slight angle relative to the optical axis of the light to cause total internal reflection at the internal surface incorporating the electrode array. Successive sets of digital bits or analog samples, representing respective collections of picture elements or pixels for successive lines of an image, are sequentially applied to the electrode array. Localized electric bulk or fringe fields developed in the crystal in proximity to the TIR incidence of light modulate the light and change the phase front of the sheetlike light beam in imagewise configuration onto the charged photosensitive medium. Examples and teachings relative to electro-optic line printer applications may be found in U.S. Pat. Nos. 4,367,925; 4,369,457; 4,370,029; 4,437,106; 4,450,459; 4,480,899 and 4,483,596.

What is needed for the electro-optic line modulator and its printer application is a single solid state light source capable of providing a sheetlike, uniform and high intensity beam of light.

SUMMARY OF THE INVENTION

According to this invention, a light source comprising a semiconductor laser comprises a plurality of deposited semiconductor layers including an active region consisting of a plurality of layers forming at least two quantum wells in the active region. The layers immediately adjacent to the active region provide confinement for light generated in one or more optical cavities established in the active region and propagating between end facets of the source. Means, such as in the form of an antireflection (AR) coating, is provided to convert the semiconductor laser into a superluminescent LED source. Further, means is provided to broaden the wavelength spectral emission from the source by rendering the energy levels present in the quantum wells to be at different levels between or among the quantum wells. The resulting output beam has high output intensity and a uniform far field pattern without intensity variation along the beam width.

The solid state LED side-facet emitter source has broad uniform far field emission and high brightness density for line printer applications, eliminating the necessity for an array of individually addressable LEDs required as a light source in the past. Deposited on one facet of the LED source is an AR coating (single or multilayer) with an index of refraction chosen to be approximately midway between the effective modal refractive index of the source and the refractive index of air.

The refractive index of the AR coating is approximated according to the formula $n_{AR} = \sqrt{n_{air} n_{active}}$ wherein $n_{active}$ is the refractive index of active region material of the source, e.g., GaAs, and $n_{air}$ is the refractive index of air, i.e., 1. $n_{AR}$ represents a midway match between the effective modal refractive index of the LED source and the refractive index of air. This midway match is approximated by the refractive index active region of the LED source. For example, in the case of an active region of GaAs, which has a refractive index of 3.6, $n_{AR}$ would be about 1.9. This midway index value comes close to the compound index value for $SiO_x$ (where x is from 0 to 2), $Si_3N_4$, $ZrO_2$ and $TiO_2$.

The active region may comprise a single active layer, a single quantum well or a multiquantum well. The LED may be an emitter in the visible or infrared region of the spectrum.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic side view of an electro-optic line printer to carry out the present invention.

FIG. 2 is a plan view of the line printer shown in FIG. 1.

FIG. 9 is a perspective schematic view of one embodiment of an LED source for use in this invention.

FIG. 10 is a schematic view of another embodiment of a multiple quantum well structure for an LED source for use in this invention.

FIG. 11 is a schematic view of another embodiment of a multiple quantum well structure for an LED source for use in this invention.

FIG. 13 is still another embodiment of a single quantum well visible heterostructure LED source for use in this invention and which admits light in the visible spectrum.

DETAILED DESCRIPTION OF THE PREFERRED EMBODIMENTS

Referring to FIGS. 1 and 2, there is disclosed an electro-optic line printer 11 having a fringe field responsive multigate light valve or TIR line modulator 12 for printing an image on a photosensitive recording medium 13. As shown, the recording medium 13 is a photoconductively coated drum 14 which is rotated (by means not shown) in the direction indicated by arrow 13A. Nevertheless, it will be evident that there are other xerographic and non-xerographic recording media that could be used, including photoconductively coated belts and plates, as well as photosensitive films and coated papers. Thus, in the generalized case, the recording medium 13 should be visualized as being a photosensitive medium which is exposed while advancing in a cross line or line pitch direction relative to modulator 12.

Figure 3:
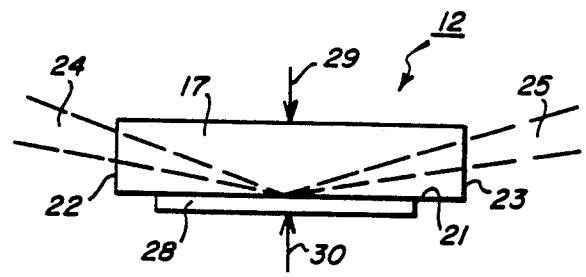
FIG. 3 is an enlarged side view of a TIR multigate line modulator.
Figure 4:
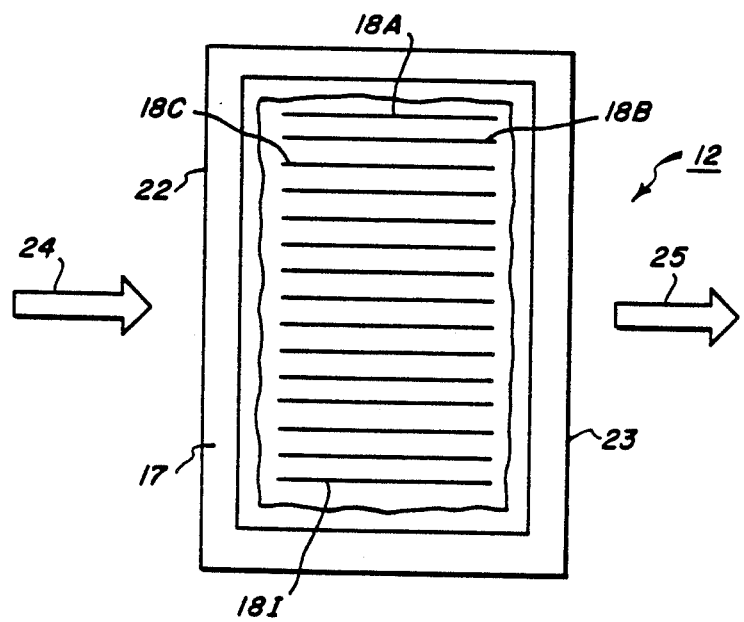
FIG. 4 is an enlarged bottom view of the modulator shown in FIG. 3 to illustrate the individually addressable electrodes of the modulator.

As best illustrated in FIGS. 3 and 4, modulator 12 comprises an optically transparent electro-optic element 17 and a plurality of individually addressable electrodes 18A-18I. The most promising electro-optic materials for such a device presently appear to be $LiNbO_3$ and $LiTaO_3$, but there are others which warrant consideration, including BSN, KDP, $Kd^xP$, $Ba_2NaNb_5O_{15}$ and PLZT. In this particular embodiment, modulator 12 is operated in a TIR mode. Thus electro-optic element 17 is suitably a y-cut crystal of say $LiNbO_3$ having an optically polished reflecting surface 21 extending between opposed, optically polished input and output faces 22 and 23, respectively. Typically, each of the electrodes 18A-18I is 1-30 microns wide, and the interelectrode gap spacing is 1 to 30 microns.

Referring to FIGS. 1 through 4 for a brief review of the operation of modulator 12, it will be seen that a sheetlike collimated light beam 24 from an LED light source 15 is transmitted, via front end optics 16, through input face 22 of electro-optic element 17 at a grazing angle of incidence relative to reflecting surface 21, i.e., an angle no greater than the critical angle of incidence for total internal reflectance from that surface.

The input beam 24 is laterally expanded by optics 16 so that it more or less uniformly illuminates substantially the full width of the electro-optic element 17 and is brought to a wedge shaped focus 24A by optics 16 on reflecting surface 21 approximately midway through electro-optic element 17. Accordingly, input beam 24 is totally internally reflected from reflecting surface 21 to provide an output beam 25 which exits from the electro-optic element 17 through its output face 23.

The phase front or the polarization of output beam 25 is spatially modulated in accordance with the data applied to electrodes 18A-18I. More particularly, if the data creates a voltage drop between any adjacent pair of electrodes, such as electrodes 18B and 18C, a corresponding fringe field is coupled into electro-optic element 17, thereby producing a localized variation in its refractive index. To efficiently couple such fringe fields into electro-optic element 17, electrodes 18A-18I are supported on or very near reflecting surface 21 thereof. Electrodes 18A-18I preferably are deposited on a suitable substrate, such as a VLSI silicon circuit 28, which is pressed or otherwise firmly held against electro-optic element 17, as indicated by the arrows 29 and 30, to maintain electrodes 18A-18I in contact with, or at least closely adjacent, reflecting surface 21. The advantage of this construction is that VLSI circuit 28 may be used to make the necessary electrical connections to electrodes 18A-18I. Alternatively, electrodes 18A-18I could be deposited on reflecting surface 21 of electro-optic element 17.

For illustrative purposes it has been assumed that the phase front of the output beam 25 is spatially modulated in accordance with the data applied to electrodes 18A-18I. Accordingly, Schlieren central dark field or bright field imaging optics are used to convert the phase front modulation of the output beam 25 into a correspondingly modulated intensity profile and to supply any magnification that may be needed to obtain an image of the desired size at the surface of recording medium 13. More particularly, as shown, there is a central dark field imaging optics 31 comprising a field lens 34, a central stop 35, and an imaging lens 36. The field lens 34 is optically align between output face 23 of electro-optic element 17 and stop 35 to focus substantially all of the zero order diffraction components of the output beam 25 onto stop 35. However, the higher order diffraction components of output beam 25 scatter around stop 35 and are collected by imaging lens 36 which, in turn, focuses these components onto recording medium 13 to provide an intensity modulated image of modulator 12.

Referring again to FIG. 4, it will be noted that each of the electrodes 18A-18I is individually addressable. Therefore, to print an image, differentially encoded data samples for successive lines of the image are sequentially applied to electrodes 18A-18I. As a matter of definition, each differentially encoded data sample, other than the first sample for each line of the image, has a magnitude which differs form the magnitude of the previous differentially encoded sample by an amount corresponding to the magnitude of a particular input data sample. The first differentially encoded sample for each line is referenced to a predetermined potential, such as ground. Thus, when the differentially encoded data samples for any given line of the image are applied to electrodes 18A-18I, the picture elements for that line are faithfully represented by the electrode-to-electrode voltage drops at modulator 12.

To supply the differentially encoded data samples, serial input data samples representing adjacent picture elements or pixels for successive lines of an image are applied to a differential encoder at a predetermined data rate. The encoder differentially encodes these input samples on a line-by-line basis, and a multiplexor ripples the encoded data samples onto electrodes 18A-18I at a ripple rate which is matched to the data rate. The input data may be buffered to match the input data rate to any desired ripple rate.

Alternatively, a set of ground plane electrodes (i.e., not shown, but defined as being electrodes referenced to the same voltage level as the raw input data samples) may be interleaved with the individually addressable electrodes, thereby avoiding the need for differential encoding. As a general rule, however, the advantages of reducing the number of electrodes required to achieve a given resolution justify the additional circuitry needed for differential encoding.

For printer 11 in the sagittal direction, optics 16 images the near field light from LED source, which may, for example, be one quarter to one micron wide spot, onto modulator 12. This spot image is imaged down to be one diffraction limited spot wide in modulator 12. The output 25 from modulator 12 is then broadened out, for example, to a 10 micron spot for a one micron LED source spot. In the tangential direction, the light is collimated by the optics 16 at modulator 12 so that it is illuminated with the far field of LED source 15.

Thus, each adjacent pair of electrodes, such as the electrodes 18B and 18C shown in FIG. 4, cooperate with electro-optic element 17 and readout optics 31 to effectively define a local modulator for creating a picture element or pixel at a unique, spatially predetermined position along each line of an image to be replicated at medium 13.

Figure 5A:
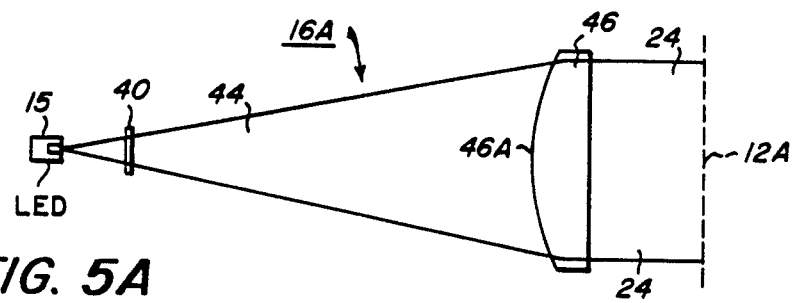
FIG. 5A is a tangential schematic view of one embodiment for the front end optics of the electro-optic line printer of FIG. 1.

Reference is now made to optics 16 for collimating and focussing sheetlike beam 24 to a wedge-shaped line 24A onto the surface of modulator 12. FIGS. 5 and 6 represent two examples for each optics 16 in FIGS. 1 and 2.

Figure 5B:
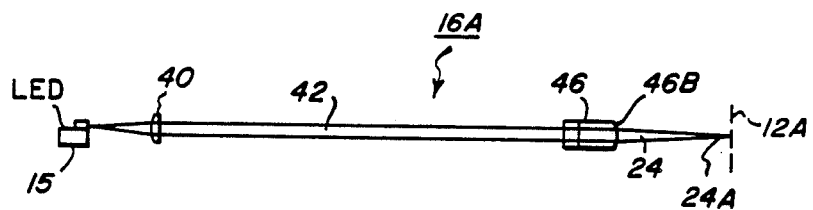
FIG. 5B is a sagittal schematic view of the embodiment shown in FIG. 5A.
Figure 6A:
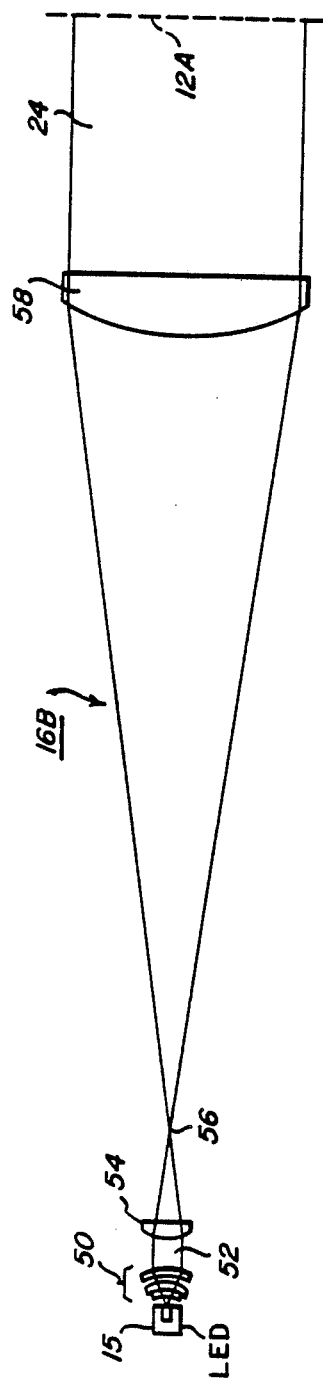
FIG. 6A is a tangential schematic view of another embodiment for the front end optics of the electro-optic line printer of FIG. 1.
Figure 6B:
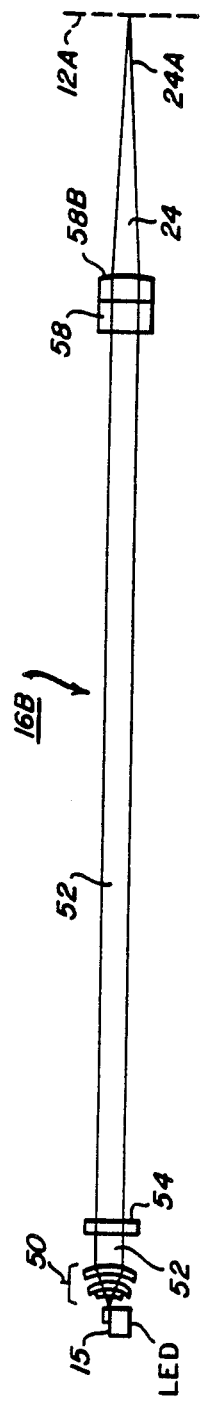
FIG. 6B is a sagittal schematic view of the embodiment shown in FIG. 6A.

In optics 16A of FIG. 5, the divergent light from LED source 15 is first collimated in the sagittal direction by cylinder lens 40 (FIG. 5B) to form a collimated beam 42. In the tangential direction, the cylindrical front surface 46A of toric lens 46 collimates the divergent light 44 from source 15 into a sheetlike beam 24 while in the sagittal direction, the cylindrical back surface 46B of toric lens 46 focusses the sheetlike beam to a wedge-shaped configuration 24A forming a focussed line image on plane 12A of modulator 12. Lenses 40 and 46 are relatively simple and inexpensive components and may be formed of plastic.

A more expensive but more efficient collection of light from LED 15 is available with optics 16B disclosed in FIG. 6. In order to collect more light or power from LED source 15, a microscope objective lens system 50 is employed at the front facet of the LED. The objective lens system 50 collects a wide angle of light from source 15 and produces a collimated beam 52 of light in both the tangential and sagittal directions. Cylinder lens 54 in the tangential direction focusses the beam to a virtual point 56 which is refocussed and collimated by cylindrical front surface 58A of toric lens 58 onto image plane 12A. In the sagittal direction, the collimated beam 52 is focussed by cylindrical back surface 58B of toric lens 58 to a wedge-shaped configuration 24A forming a focussed line image on plane 12A of modulator 12.

As indicated previously, optics system 16B provides for collection of more light from led source 15 in utilizing the objective lens system 50. Thus, an LED source with less power output may qualify for use with optics 16B. The optics system 16A does not utilize such a light collection system, thereby eliminating this expense, but will require a higher power LED source 15 to provide the same level of light intensity required for printer 11.

Figure 7:
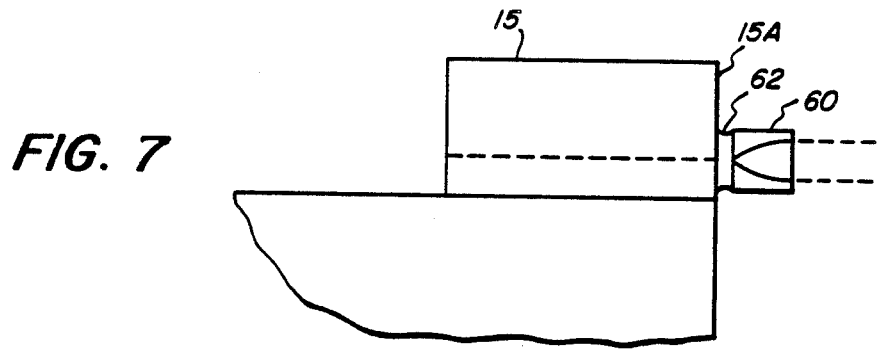
FIG. 7 is an enlarged view of an LED source in this invention with an attached selfoc lens.
Figure 8:
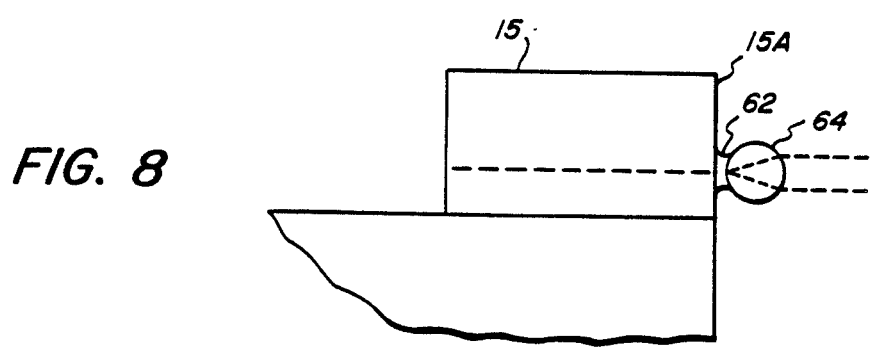
FIG. 8 is an enlarged view of an LED source of this invention with an attached microlens.

As an alternative to the front lenses for optics 16A and 16B, a selfoc lens 60 or a microlens 64 may be secured by adhesive or epoxy 62 to front facet 15A of LED source 15 as shown in FIGS. 7 and 8. Microlens 64 may be a ball lens or a hemispherical lens or may be a cylinder lens 64 as depicted in FIG. 8.

The single LED source 15 for line modulator 12 must have (1) a sufficient amount of brightness, being power per unit area, e.g., watts per square micron, at the source facet and (2) a far field pattern of uniform intensity. As previously indicated, coherent lasers have modal structures in the far field so that there are regions of bright spots and regions of dim spots. These types of sources are inadequate for the line modulator and printer application shown in FIGS. 1 and 2. On the other hand, LEDs may provide uniformity in the far field but do not have sufficient power output necessary for printer applications, requiring, for example, more than one LED source to obtain sufficient output power. However, individual LEDs in an array do not have identical uniformity in power output, so again, something must be done to provide for uniform intensity across the array in the far field as in the BACKGROUND OF THE INVENTION.

In FIG. 9, the LED facet source 15 comprises a multi-emitter, multiquantum well structure with a high reflecting stack on the rear facet of the source and an antireflecting coating on the front facet of the source. LED source 15 comprises substrate 72 of a N-GaAs upon which is epitaxially deposited cladding layer 74 of n-Ga$_{1-x}$Al$_x$As where x (for example) is equal to 0.4 active region 76 of a multiquantum well structure comprising, for example, alternating layers of four wells consisting of Ga$_{0.94}$Al$_{0.06}$As and of three barriers consisting of Ga$_{0.8}$Al$_{0.2}$As, cladding layer 78 of p-Ga$_{1-x}$Al$_x$As where, for example, x is equal to 0.4, and cap layer 80 p$^+$-GaAs. A selective proton implant 82 is formed through cap layer 80 into cladding layer 78 delineating a plurality of contact stripes 84 for pumping source 15. In the embodiment shown, there are twenty pumping stripes and twenty emitters 76A. A metal contact 86, such as chromium/gold, is vapor deposited on the surface of cap layer 80. Also, a metal contact may be provided on the bottom surface of substrate 72. Source 15 may be, for example, about 250 μm long and about 200 μm wide.

It should be realized that the specific molar contents and the stripe configuration in the embodiment illustrated in FIG. 9 are only a single example of such a range of values and configuration, as there are a multitude of other values and configurations that would equally apply, as is known to those skilled in the art.

In the embodiment shown, there are twenty emitters 76A, although the number of emitters may be more or less in number depending upon power requirements need. Emitters 76A are sufficiently close to one another so that the evanescent wave of light produced in the cavities of the emitters will overlap into adjacent cavities. It should be noted, however, that this is not a necessary criteria, as the emitter may be sufficiently far apart as long as optics 16 is capable of collecting the light from the array of sources through a single aperture lens system. As a criteria, the spacing between stripes 84 may be in the range of zero (broad emitter) to about 20 μm. In FIG. 9, the stripes 84 are 3.5 μm wide with a 10 μm center to center spacing. There is some limit to the minimum width of the array of emitters since stop 35 used to block the zero order modulator light must be large enough to block them all but not so large that is impedes proper imaging by the optics.

A dielectric mirror stack 88 may be vapor deposited on the back facet of source 15. Stack 88 may not be necessary in all applications, particularly where power requirements are not high, in which case it may be preferred to use an AR coating on this rear facet. Stack 88 is composed of alternating layers of two different materials that also differ in refractive index. An example for stack 88 are six alternating layers of quarter wavelength thick Al$_2$O$_3$ and Si, as is known in the art. Stack 88 provides a high level of reflectivity for emitters 76A and may be about 95% reflectivity. Other mirror stacks may be employed, such as alternate quarter wavelength layers of GaAs and GaAlAs.

An antireflecting (AR) coating 90 is formed on the front facet of source 15. AR coating 90 may be deposited on the front facet or, preferably, a facet protection passivation layer 92 may be initially applied to protect the facet surface from contamination during handling of LED source 15, such as during the deposit of the source contact 86 and mirror stack 88 and during the process of depositing AR coating 90. Layer 92 may be a very thin coating of Al$_2$O$_3$, e.g., 30 nm thick. Passivation layer 92 may also be applied to the rear facet of source 15 prior to deposition of mirror stack 88 to also protect that.

An optimum AR coating 90 is approximated according to the formula, $n_{AR} = \sqrt{n_{air} n_{GaAs}}$, which is equal to approximately 1.9 and is a midway match between the effective modal refractive index of the the LED structure, which is approximately the refractive index of GaAs, which is 3.6, and the refractive index of air, which is 1.0. This index value of 1.9 comes close to the refractive index value for SiO$_x$ (where x is from 0 to 2), ZrO$_2$, TiO$_2$ or Si$_3$N$_4$ or any other materials with a refractive index approximating 1.9 AR layer 90. In the case of certain nitrides and oxides, e.g. SiO$_x$, the refractive index can be varied as the coating is applied to the LED source facet. This variance in molar fraction can be utilized to achieve optimization in the AR coating. For example, the refractive index of SiO$_x$ can be varied as the same is be deposited on the LED source facet where x is varied beginning with x=0 and ending with x=2.

We have found that ZrO$_2$ is particularly suited as an AR coating for the application of this invention.

Layer 90 may be sputter deposited or electron beam deposited on the surface of passivation layer 92 in an E beam deposition system. SiO$_x$ and Si$_3$N$_4$ may be best applied via sputtering. ZrO$_2$ may be best applied via E beam deposition. As an example, LED source 15, when placed in an E beam deposition system and mounted to operate in situ, will initially function as a laser device, since the front facet will act as a partial mirror providing feedback for lasing conditions. However, as the AR coating is deposited on the front facet and the thickness of AR layer 90 approximates a quarter wavelength of the primary source emission, the lasing action of the source will not be sustained due to lack of sufficient optical feedback and source 15 will begin to function as a superluminescent source.

The following process is followed in order to determine that a maximum antireflectivity level has been obtained during the deposition of AR coating 90. As indicated above, source 15 is mounted in an E beam chamber and operated under lasing conditios. The mirror stack 88 present on the back facet, not being a perfect reflector, permits the monitoring of a portion of the light, for example, 5% emission, from the back facet of source 15 as the AR coating 90 is being deposited on the front face. This is adequate for monitoring the output power of source 15. As AR layer 90 is being electron beam deposited on the front facet on passivation layer 92, the power from the back facet is monitored. As the coating process proceeds, the back facet monitored power will continue to drop until a null or plateau is reached. This is a direct indication of the lowest point of anti-reflectivity at the front facet and a direct indication that the optimum thickness for AR layer 90 has been achieved without any need of actually measuring its actual thickness to determine if it is a quarter wavelength thick.

We have discovered that an AR layer 90 using the aforementioned compounds and applied in the manner described provides reflectivity level as low as 10$^{-4}$ to $10^{-5}$ and recognized these types of AR coatings as a means to provide a high power output LED source with a high level of brightness and power density, and excellent far field uniformity.

It should be noted that mutilayer AR coatins can equally apply in the application of this invention, particular since such mutilayer coatings will provide AR properties over a greater bandwidth as is known in the art. As to mutilayer AR coatings and their properties and mathematical considerations, see the Article of Gary W. DeBell entitled "Visible Anti-Refraction Coatings and Their Use".

An LED source of the type shown in FIG. 9 provides an aperture of about one quarter to one micron width. The CW power of LED source 15 at room temperature is 350 mW, which represents an optical power density of 1.8 mWatts per micron square. This type of power density has not been realized in LED sources disclosed in the art known to us. For the application relative to printer 11, the output power, for example, would need to be about 60 mWatts at 820 nm wavelength emission and the power output of LED source 15 more than adequately fulfills this requirement.

One factor for achievement of high power densities is that heating of LED source 15 due to CW operation increases the operating threshold which prevents attempts of source 15 to commence lasing action.

A multiple quantum well structure for active region 76 of LED source may be preferred since it provides for good gain and renders the established optical cavities of emitters 76A more transparent, i.e., the propagation of light along the cavities will occur with very little absorption. However, other types of active regions may be employed albeit possibly requiring higher power outputs to accommodate printer 11. Embodiments of other types of LEDs useful in the practice of this invention are disclosed in FIGS. 10–13. In all cases illustrated, it should be noted that the front facet AR coating or layer 90 and the back facet high reflecting means 88 would be applied to each of these LED structures. Only a portion of the structures is illustrated in each case in the from of a bandgap profile of the regions of the LED source that are relatively different from the LED structure shown in FIG. 9. Thus, other component layers may be the same as combined with the alterations as illustrated in the following bandgap profiles.

In FIG. 10, another multiquantum well structure is illustrated for active region 76. Region 76A comprises four wells 94A, 94B, 94C and 94D and three barriers 96. Wells 94 are of each of a progressively different width, i.e., the width of well 94D>94C>94B>94A. As a result, the quantum size effect in each well is different and the lowest energy level, $E_1$, is at a different level as illustrated in FIG. 10.

In FIG. 10, the changes in well width have been shown incrementally across the structure. However, well width changes can also be random, i.e. it is not necessary that the width change be progressive from one end of the structure to the other end but the well widths may be consecutively different random widths progressively across the structure.

The differences in lowest energy levels for wells in a multiple quantum well structure may also be obtained by changing the compositional content of the well, e.g., by varying the aluminum content in the wells across the quantum well structure. This is illustrated in FIG. 11. Active region 76B comprises a multiple quantum well structure of four quantum wells 98A, 98B, 98C and 98D and three barriers 100. Starting with well 98D, the aluminum content is sequentially increased across the well structure so that wells 98 are of each of progressively different bandgap depth, i.e., well 94D is deeper than well 94C, which is deeper than well 94B, which is deeper than well 94A. As a result, the quantum size effect in each well is different and the lowest energy level, $E_1$, is at a different level as illustrated in FIG. 11.

In FIG. 11, the changes in bandgap depth have been shown incrementally across the structure. However, bandgap depth changes can also be random, i.e., it is not necessary that the bandgap depth change be progressive from one end of the structure to the other end but the bandgap depth may be consecutively different random bandgap depths progressively across the structure.

It should be noted that a third alternative of the multiple quantum well structures of FIGS. 10 and 11 would be the combination of the attributes of both of these multiple well structures, i.e., the wells may be varied in both width and depth.

In any case, the multiple quantum well structures of FIGS. 9 and 10 have the advantage of providing broader band of emission from the LED source 15 for a given wavelength.

Figure 12:
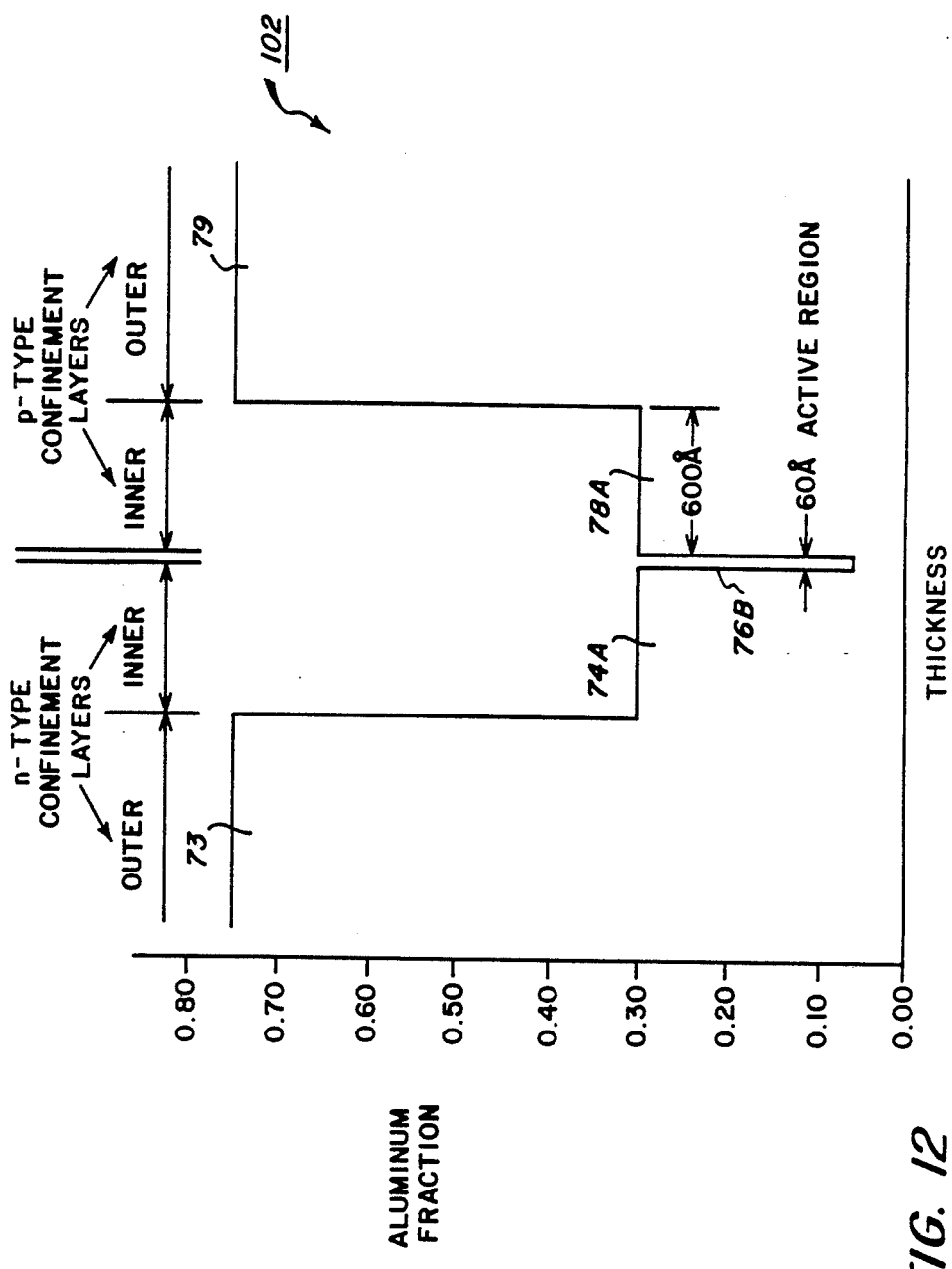
FIG. 12 is another embodiment of a separate confinement, single quantum well structure for an LED source for use in this invention.

The bandgap profile in FIG. 12 illustrates an example of a separate confinement, single quantum well structure 102 which operates in a particular range of wavelengths. Structure 102 contains an active region comprising a single quantum well 76B which is 6 nm thick and comprises $Ga_{0.95}Al_{0.05}As$. Inner cladding or confinement layers 74a and 74B respectively comprise n-$Ga_{0.70}Al_{0.30}As$ and p-$Ga_{0.70}Al_{0.30}As$ and are each about 60 nm thick. Outer cladding or confinement layers 73 and 79 respectively comprise n-$Ga_{0.25}Al_{0.75}As$ and p-$Ga_{0.25}Al_{0.75}As$. The active region 76B is doped with Mg and being very thin provides a broad area emitter with wavelengths in the range of 770 nm to 780 nm depending on doping levels and thickness parameters of the confinement layers and the active region.

An advantage of single quantum well structure 102 is its capability of producing high output powers at short wavelengths. For both pulsed and CW operation, the output power levels for a multiple cavity LED are as high as 210 mW per facet which is more than sufficient for the application of printer 11 (e.g., 60 mWatts at 820 nm). Thus, source 15 with this configuration may be a single or multiple cavity LED. Different parameters from those of the example above would allow different ranges of wavelengths.

FIG. 13 illustrates the bandgap profile of another single quantum well structure 104 which emits in the visible range. The layers sequentially shown are an outer layer 106 of n-$Ga_{0.85}Al_{0.15}As$ about 0.4 μm thick and Se doped approximately $1 \times 10^{18}$ cm$^{-3}$, outer cladding or confinement layer 108 of n-$Ga_{0.6}Al_{0.4}As$ about 1.4 μm thick and Se doped approximately $5 \times 10^{17}$ cm$^{-3}$, an inner cladding or confinement, high aluminum content layer 110 of n-$Ga_{0.15}Al_{0.85}As$ about 1.3 μm thick and Se doped approximately $3 \times 10^{17}$ cm$^{-3}$, an active region 112 of undoped $Ga_{0.78}Al_{0.22}As$ about 30 nm thick, an inner cladding or confinement, high aluminum content layer 114 of p-$Ga_{0.15}Al_{0.85}As$ about 1.3 μm thick and Mg doped approximately $2 \times 10^{18}$ cm$^{-3}$, an outer cladding or confinement layer 116 of p-$Ga_{0.6}Al_{0.4}As$ about 1 μm thick and Mg doped approximately $1 \times 10^{18}$ cm$^{-3}$, and outer layer 118 of p-$Ga_{0.85}Al_{0.15}As$ about 0.4 μm thick and Mg doped approximately $1 \times 10^{18}$ cm$^{-3}$. The primary emission wavelength from this structure may be in the range of 640 nm to 780 nm, which is primarily in the visible range of emission. For printer 11, an example for desired characteristics for visible emission is 30 mW at 665 nm. A multiple cavity LED source 15 incorporating single quantum well structure 104 can provide as much as 200 mW output power at 730 nm at room temperature CW operation.

Other alloy systems may be used to fabricate LED sources with visible emission wavelengths, e.g., CaAlAs/InGaP/GaAlAs or AlGaInP/InGaP/AlGaInP.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a light source comprising a semiconductor laser comprising a plurality of deposited semiconductor layers, an active region in said source and comprising a plurality of layers forming at least two quantum wells in said active region, a p-n junction is proximity to said active region, the layers immediately adjacent to said active region providing confinement for light generated in at least one optical cavity established in said active region and propagating between end facets of said source, means to convert said semiconductor laser into a superluminescent LED source, means to broaden the wavelength spectral emission from said source by rendering the energy levels present in said quantum wells to be at different levels between or among said quantum wells thereby producing an output beam having high output intensity and a uniform far field pattern without intensity variation along the beam width.

2. In the light source of claim 1 wherein said means to convert comprises AR means deposited on one of said facets, the refractive index of said AR means chosen to be approximately midway between the effective modal refractive index of said source and the refractive index of air.

3. In the light source of claim 2 wherein the refractive index of said AR means is approximated according to:

$$n_{AR} = \sqrt{n_{air} n_{active}}$$

wherein $n_{air}$ is the refractive index of air and $n_{active}$ is the effective refractive index of the optical mode propagating in said active region.

4. In the light source of claim 2 wherein said AR means is a single coating selected from the group consisting of $SiO_x$, $Si_3N_4$, $ZrO_2$ and $TiO_2$.

5. In the light source of claim 2 wherein said AR means is a multilayer coating.

6. In the light source of claim 2 wherein said active region has a plurality of spatially disposed optical cvities to provide a plurality of emitters.

7. In the light source of claim 1 wherein said means to broaden the wavelength spectral emission is characterized in that said quantum wells vary in thickness across said active region.

8. In the light source of claim 1 wherein said means to broaden the wavelength spectral emission is characterized in that said quantum wells vary in bandgap across said active region.

9. In the light source of claim 1 wherein said means to broaden the wavelength spectral emission is characterized in that said quantum wells vary in both thickness and bandgap across said active region.

10. In the light source of any one of claims 1 through 9 inclusive wherein said source admits radiation in the visible spectrum.

11. In the light source of any one of claims 1 through 9 inclusive wherein said source admits radiation in the infrared spectrum.

12. In the light source of claim 2 wherein high reflective means is deposited on the other of said facets.

13. In the light source of claim 12 wherein said high reflective means comprises alternating layers of $Al_2O_3$ and silicon.

14. In the light source of claim 2 wherein a passivation layer is deposited on said one facet prior to the deposition of said AR means.

15. In the light source of claim 14 wherein said passivation layer comprises $Al_2O_3$.

* * * * *